United States Patent
Lin et al.

(10) Patent No.: US 9,373,552 B2
(45) Date of Patent: *Jun. 21, 2016

(54) METHOD OF CALIBRATING OR EXPOSING A LITHOGRAPHY TOOL

(71) Applicant: Taiwan Semiconductor Manufacturing Company, Ltd., Hsin-Chu (TW)

(72) Inventors: Yu Chao Lin, Hsinchu (TW); Chia-Hao Hsu, Hsinchu (TW); Kuo-Yu Wu, Miaoli County (TW); Chia-Jen Chen, Chiayi (TW); Chao-Cheng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/835,140

(22) Filed: Aug. 25, 2015

(65) Prior Publication Data

US 2015/0364383 A1    Dec. 17, 2015

Related U.S. Application Data

(63) Continuation of application No. 13/673,729, filed on Nov. 9, 2012, now Pat. No. 9,128,384.

(51) Int. Cl.
| | |
|---|---|
| H01L 21/66 | (2006.01) |
| G03F 7/20 | (2006.01) |
| H01L 21/033 | (2006.01) |
| G03F 7/00 | (2006.01) |
| G03F 7/075 | (2006.01) |
| G03F 7/09 | (2006.01) |
| G03F 7/095 | (2006.01) |
| G03F 7/40 | (2006.01) |

(Continued)

(52) U.S. Cl.
CPC .............. *H01L 22/12* (2013.01); *G03F 7/0035* (2013.01); *G03F 7/0752* (2013.01); *G03F 7/091* (2013.01); *G03F 7/095* (2013.01); *G03F 7/40* (2013.01); *G03F 7/70633* (2013.01); *H01L 21/0276* (2013.01); *H01L 21/0337* (2013.01); *H01L 21/31144* (2013.01); *H01L 21/32139* (2013.01)

(58) Field of Classification Search
CPC ................ H01L 22/12; H01L 21/0276; H01L 21/31144; G03F 7/70633; G03F 7/0035; G03F 7/0752; G03F 7/091; G03F 7/095; G03F 7/40; G03F 7/706683; G03F 7/70616; G03F 7/70608
USPC ........................................................... 438/14
See application file for complete search history.

(56) References Cited

U.S. PATENT DOCUMENTS

| | | |
|---|---|---|
| 6,428,894 B1 | 8/2002 | Babich et al. |
| 7,253,113 B2 | 8/2007 | Cheng |

(Continued)

*Primary Examiner* — Savitr Mulpuri
(74) *Attorney, Agent, or Firm* — Haynes and Boone, LLP

(57) ABSTRACT

A method of calibrating or monitoring an exposing tool including forming a substrate pattern in a substrate, wherein forming the substrate pattern includes providing a first patterned photo resist layer having an etch coating layer disposed thereon and using the first patterned photo resist layer and the etch coating layer to pattern an underlying layer. The patterned underlying layer is then used as a masking element when etching the substrate pattern into the substrate. A second photo resist pattern is formed over the substrate pattern. An overlay measurement is executed of the second photo resist pattern to the substrate pattern.

20 Claims, 7 Drawing Sheets

(51) Int. Cl.
*H01L 21/027* (2006.01)
*H01L 21/311* (2006.01)
*H01L 21/3213* (2006.01)

(56) References Cited

U.S. PATENT DOCUMENTS

| | | |
|---|---|---|
| 7,328,418 B2 | 2/2008 | Yamashita et al. |
| 8,053,323 B1 | 11/2011 | Lin et al. |
| 8,153,351 B2 | 4/2012 | Wallow et al. |
| 8,772,183 B2 | 7/2014 | Hsieh et al. |
| 8,912,097 B2 | 12/2014 | Martin et al. |
| 9,128,384 B2 * | 9/2015 | Lin .................. G03F 7/0035 |
| 2005/0219484 A1 | 10/2005 | Chiang et al. |
| 2006/0046483 A1 | 3/2006 | Abatchev et al. |
| 2009/0142931 A1 | 6/2009 | Wang et al. |

* cited by examiner

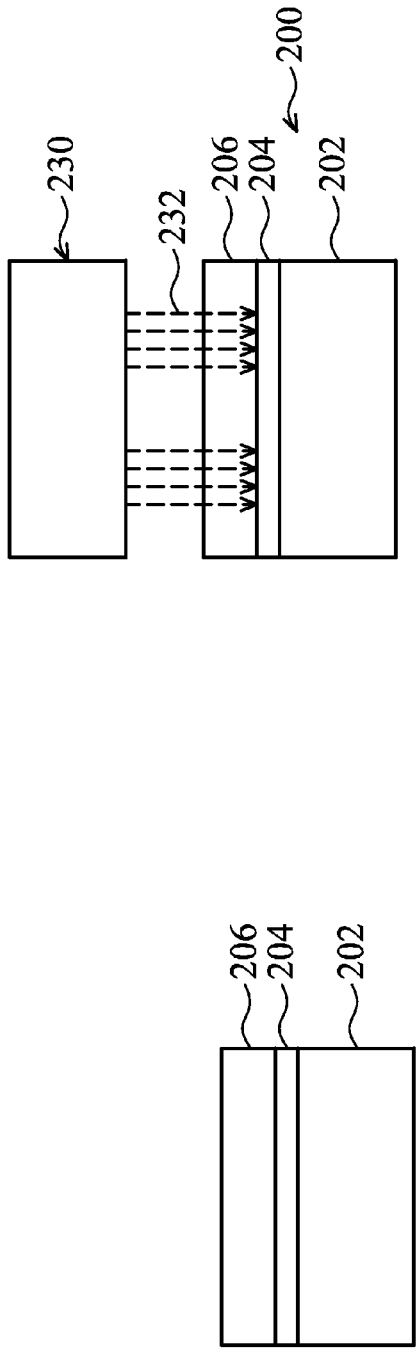
FIG. 2 (Prior art)
FIG. 3 (Prior art)
FIG. 4 (Prior art)
FIG. 5 (Prior art)

US 9,373,552 B2

METHOD OF CALIBRATING OR EXPOSING A LITHOGRAPHY TOOL

PRIORITY DATA

The present application is a continuation application of U.S. patent application Ser. No. 13/673,729, filed Nov. 9, 2012, entitled "METHOD OF FORMING A PATTERN", of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, the scaling down of a pattern may cause an unsymmetrical pattern profile on an IC device. The unsymmetrical pattern may cause issues such as a non-correctable or uncontrollable pattern-to-pattern overlay error on the IC device. In another example, an accuracy of a lithography exposing tool is impacted when using a monitor wafer with an unsymmetrical pattern monitoring or calibrating the lithography exposing tool. Accordingly, what is needed is a method forming a more symmetrical pattern.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 2-5 are cross sectional views of forming a pattern according to the method of FIG. 1.

DETAILED DESCRIPTION

Figure 1:
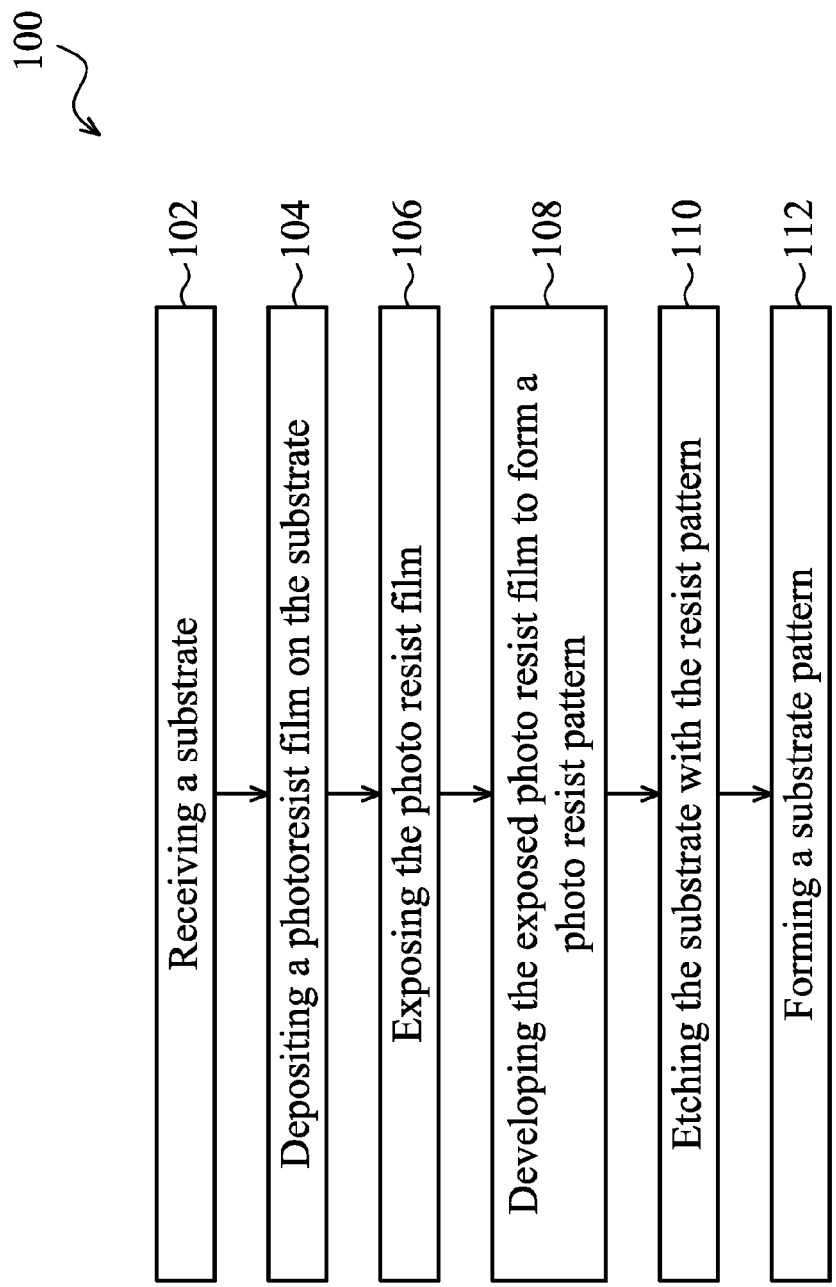
FIG. 1 is a flow chart of a method of forming a pattern in a substrate.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a conventional method 100 for forming a pattern on a substrate, such as a semiconductor wafer or photomask, is illustrated. The method 100 begins at step 102 by providing or receiving a substrate. The method 100 proceeds to step 104 by depositing a photo resist film on the substrate, for example, by a spin-on coating process. In the present disclosure, a photo resist is also referred to as a resist.

The method 100 proceeds to step 106 and exposing the photo resist film deposited over the substrate by a lithography exposing tool to form a latent image pattern on the resist film. The method 100 proceeds to step 108 by developing the exposed photo resist film to form a photo resist pattern over the substrate.

The method 100 proceeds to step 112 by etching the substrate using the patterned photo resist. Referring now to FIGS. 2-5, cross-sectional side views of forming a pattern of a device 200 using the method 100 are illustrated. As shown in FIG. 2, after receiving a substrate 202, a BARC layer 204 is deposited on the substrate 202. The substrate 202 may include a wafer and a plurality of conductive and non-conductive thin films formed thereon.

As shown in FIG. 2, the photo resist film 206 is deposited on a BARC layer 204 deposited on the substrate 202. Then, as shown in FIG. 3, the photo resist film 206 is exposed by a lithography exposing tool 230. In the present disclosure a lithography exposing tool is also referred to as an exposing tool. The lithography exposing tool 230 generates a patterned electromagnetic radiation 232 projected on the photo resist film 206.

As shown in FIG. 4, after applying a developer, a photo resist pattern 206a is formed. As shown in FIG. 5, after performing an etching process a pattern 210 is formed on the substrate 202.

Figure 6:
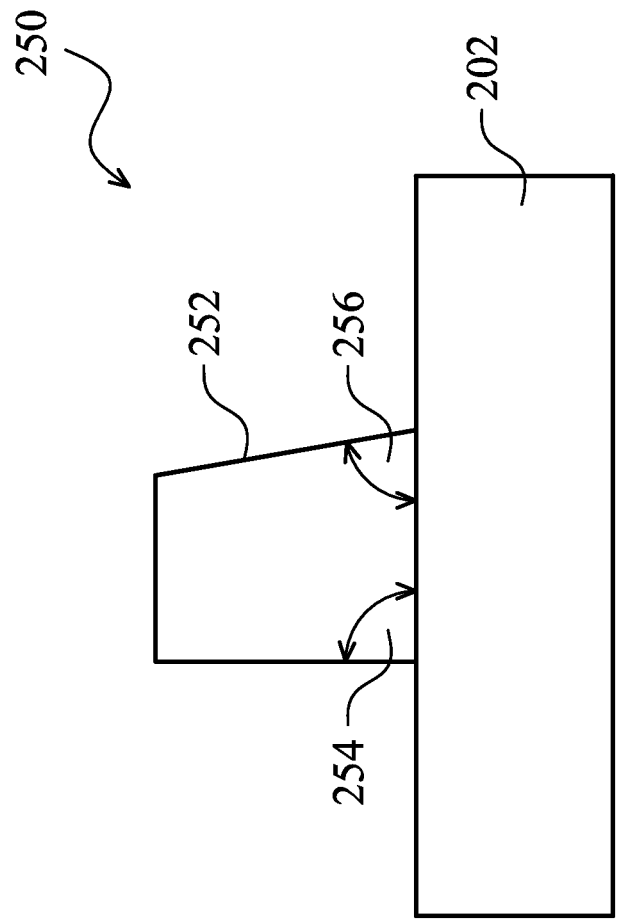
FIG. 6 is an example of a pattern profile provided by the method of FIG. 1.

Continuing with the present embodiment, FIG. 6 is an example of a pattern profile 252 formed on the substrate 202. The pattern profile 252 is not symmetric. In other words, a first side wall angle (SWA) 254 of the pattern profile 252 is not equal to a second SWA 256 of the pattern profile 252.

A non-symmetric SWA may create potential issues for a device. For example, the non-symmetric SWAs may cause critical dimension (CD) variation between a center and an edge area of a wafer out of a tolerance range or ort of a specification for a device. The CD variation between the center and the edge area of a wafer may severely impact electrical performance of a device. In one example, during exposing a wafer on a lithography exposing tool, a photo mask or a reticle (having a current pattern) is aligned to a previous pattern formed on a wafer. The alignment is performed by reading a plurality of alignment marks (or patterns) formed as previous patterns. If the reading is from non-symmetric SWA pattern, a misalignment may happen. The misalignment may be a wafer yield killer defect in a fab.

In another example, in the fab, a plurality of patterned wafers is used to monitor a lithography exposing tool or process, or calibrate a lithography exposing tool. If the patterns formed on the wafer have non-symmetric SWAs, an accuracy of the lithography exposing tool or process may be impacted by the non-symmetric SWAs of the patterns.

Figure 7:
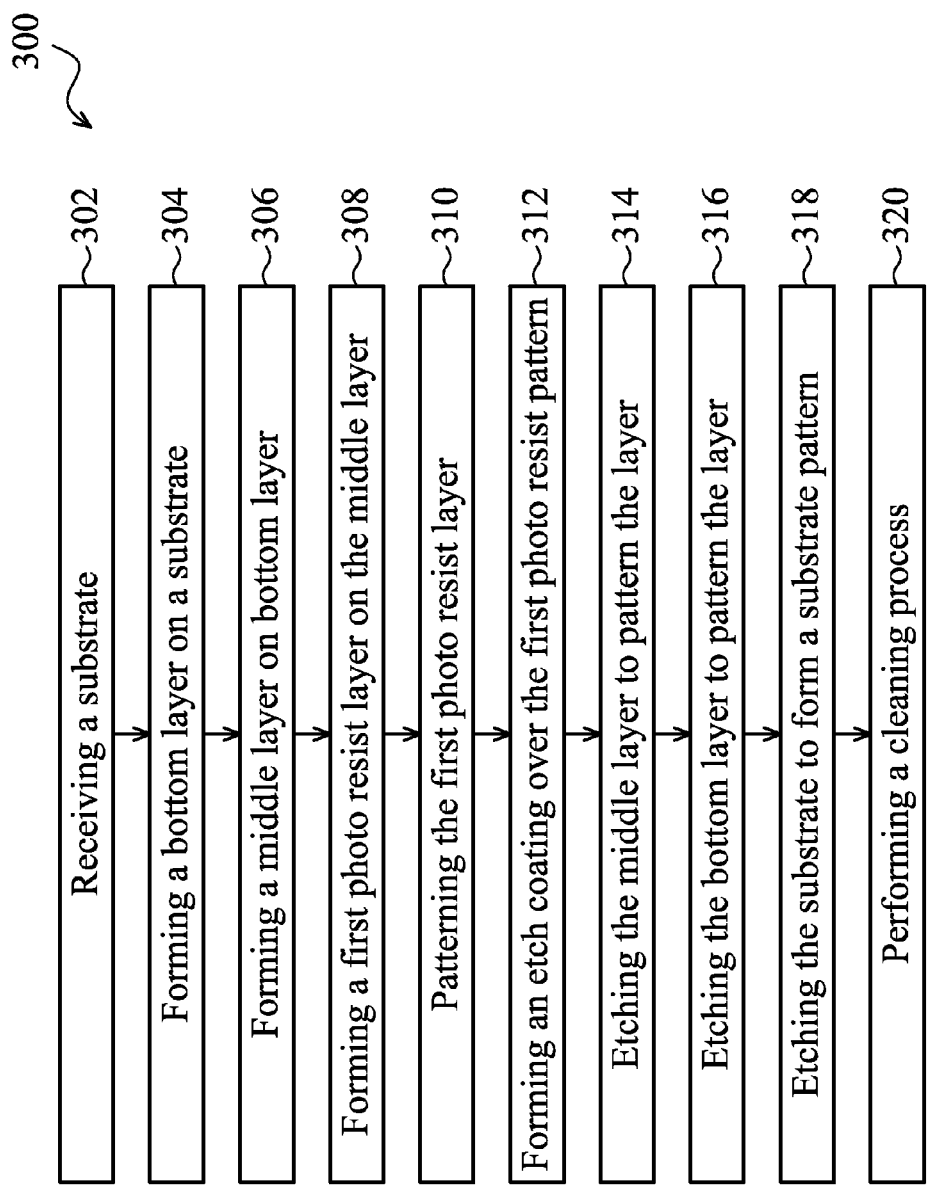
FIG. 7 is a flow chart of an embodiment of a method of forming a pattern according to one or more aspects of the present disclosure.
Figure 8:
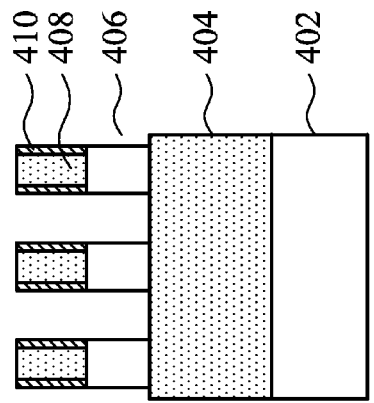
FIGS. 8-13 are cross sectional views of an embodiment of a pattern formed on a substrate using one or more embodiments of the present disclosure.
Figure 9:
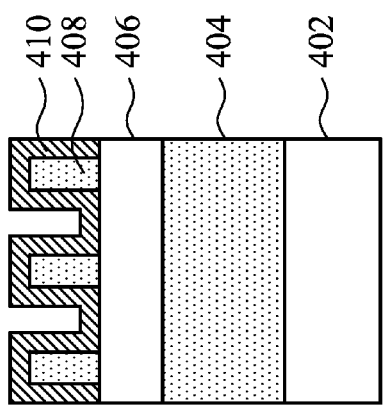
Figure 10:
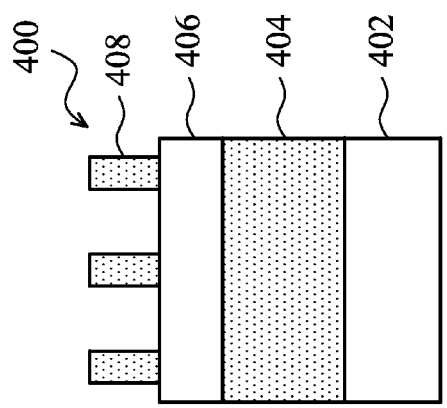
Figure 11:
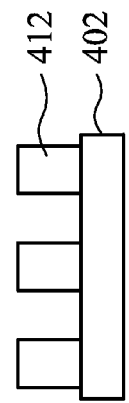

Referring to FIG. 7, a flow chart of a method 300 of forming a pattern according to one or more embodiments of the present disclosure. The method 300 may alleviate and/or reduce the non-symmetric SWA discussed above. FIGS. 8-13 are cross sectional views of forming a pattern of an exemplary device 400 according to an embodiment of the method 300.

The method 300 begins at step 302 by providing or receiving a substrate. Referring to the example of FIG. 8, a substrate 402 is illustrated. The substrate 402 may include a wafer and a plurality of conductive and non-conductive thin films. In an embodiment, the substrate 402 is a semiconductor substrate including silicon (in other words, a silicon wafer). Alternatively or additionally, the substrate 402 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride. In alternative embodiments, the substrate 402 may include a photomask.

The method 300 then proceeds to step 304 where a bottom layer is formed on the substrate, for example, by a spin-on coating process. Step 304 may include performing a dehydration process to enhance an adhesion of the bottom layer to the substrate. The dehydration process may include baking the substrate at a high temperature for a duration of time, or applying a chemical such as hexamethyldisilizane (HMDS) to the substrate. Exemplary bottom layer compositions include photoresist or other organic photosensitive materials. The thickness of the bottom layer may be between approximately 1500 and 3000 A. Referring to the example of FIG. 8, a bottom layer 404 is disposed on the substrate 402.

The method 300 then proceeds to step 306 where a middle layer is formed on the bottom layer. In an embodiment, the middle layer is formed by a spin-on coating process. The step 306 may include a soft bake (SB) process. Exemplary middle layer compositions include a silicon (Si) doped BARC layer. The BARC layer may include an organic BARC or an inorganic BARC layer. In a further embodiment, the Si-doped BARC layer may include between approximately 1 and 8 percent Si. The thickness of the middle layer may be between approximately 200 to 500 angstrom (Å). Referring to the example of FIG. 8, a middle layer 406 is disposed on the substrate 402.

The method 300 proceeds to step 308 by depositing a photo resist layer on the middle layer. The photo resist layer may be formed by a spin-on coating process. In an embodiment, the step 308 includes a soft bake (SB) process. The photo resist layer may include a positive tone resist or a negative tone resist. The photo resist layer may also include a single resist film or a multiple layer photo resist film. The photo resist layer may include an I-line or a DUV photo resist. The thickness of the photo resist layer may be between approximately 500 to 1500 Å.

The method 300 proceeds to step 310 where the photo resist layer, described above with reference to step 308, is patterned. Step 310 may include exposing the photo resist layer using a lithography exposing tool. The lithography exposing tool may generate a patterned electromagnetic radiation that is projected on the photo resist layer. The lithography exposing tool may include an ultraviolet (UV) light, a deep ultraviolet (DUV) light, an extreme ultraviolet (EUV), or an X-ray light. An exemplary lithography exposing tool is a step-and-scan tool such as the ASML NXT tool (e.g., versions 1700i, 1900i, 1950i) of the ASML N.V., Nederland. In an embodiment, the lithography exposing tool uses an energy of between approximately 10 and 30 mJ. In an embodiment, the lithography exposing tool uses a focus between approximately 0.1 and −0.1. The lithography exposing tool may alternatively include a charged particle tool, such as an electron beam writer. The lithography exposing tool 230 may include a mask, such as a binary mask or a phase shift mask (PSM). The phase shift mask may be an alternative phase shift mask (alt. PSM) or an attenuated phase shift mask (att. PSM). In the present disclosure, a mask is also referred to as a photomask or a reticle.

Step 310 may also include developing the exposed photo resist layer using a developer, such as tetramethylammonium hydroxide (TMAH). Step 310 may also include a post exposure bake (PED), a post develop bake (PDB), or both. Referring to the example of FIG. 8, a patterned photo resist layer 408 is disposed on the substrate 402, overlying the bottom layer 404 and the middle layer 406.

The method 300 proceeds to step 312 by depositing an etch coating layer on the patterned photoresist layer. Referring to the example of FIG. 9, an etch coating layer 410 is formed over the patterned photo resist layer 408. In an embodiment, the etch coating layer 410 is formed using a plasma process. For example, step 312 may also include feeding a chamber of a plasma tool with an organic compound, such as $CH_4$, $CH_4F_2$, $CH_3F$, $CH_4/Ar$, or $CH_4/He$, under a low chamber pressure. In one embodiment, the etch coating layer is formed on the photo resist pattern layer 408 with a methane ($CH_4$) gas flow. The methane gas flow ranges from approximate 10 to 200 standard cubic centimeters per minute (SCCM) under the chamber pressure ranging from approximate 5 to 20 millitorr (mTorr). Other alkanes may also be used to form the etch coating layer. The etch coating layer may include carbon (C) and hydrogen (H). In another example, step 312 includes using an etching process, such as a plasma etching process involving HBr, $HBr/O_2$, or $HBr/N_2$. Referring to the example of FIG. 10, an etch coating layer 410, an etch coating layer 410 is formed on the middle layer 406 and the patterned photo resist layer 408.

The method 300 then proceeds to step 314 where the middle layer is etched or patterned. The etch coating layer 410 may also be etched in part, for example, being removed from a top surface of the patterned photo resist layer. Referring to the example of FIG. 10, the middle layer 406 is etched using the patterned photo resist layer 408 and the etch coating layer 410 as a masking element (e.g., protecting portions of the underlying layers) to provide a patterned middle layer 406. It is noted that in the illustrated embodiment, the etching stops at the bottom layer 404. In an embodiment, step 314 includes etching the middle layer using a plasma process. For example, the step 314 of etching the middle layer may include feeding a chamber of a plasma tool with a mixture of chemical gases under a low chamber pressure. For example, in one embodiment, the mixture of chemical gases includes a fluorine-containing gas, such as $CF_4$, $SF_6$, or $CH_2F_2$. A flow rate of the mixture of chemical gases may range from approximate 10 to 100 SCCM. A chamber pressure may range from approximately 1 to 20 mTorr. These process parameters are provided by way of example and not intended to be limiting.

The method 300 proceeds to step 316 and etching of the bottom layer using the patterned photo resist layer, described above with reference to step 310, the etch coating layer, described above with reference to step 312, and/or the etched middle layer, described above with reference to step 314, as a masking element. Referring to the example of FIG. 11, the bottom layer 404 is etched to form a patterned bottom layer. In the illustrated embodiment, the etching stops at the substrate 402 (the substrate 402 may include one or more layers formed on a semiconductor wafer). In an embodiment, step 316 includes etching the bottom layer using a plasma process. For example, step 316 may include feeding a chamber of a plasma tool with a mixture of chemical gases under a low chamber pressure. In one embodiment, the mixture of chemical gases includes an oxygen-containing gas, such as $O_2$, a chlorine-containing gas, such as $Cl_2$, a bromine-containing gas, such as HBr, a sulfur-containing gas, such as $SO_2$, or combination thereof. A flow rate of the mixture of chemical gases may range from approximately 10 to 200 SCCM. The chamber pressure may range from approximately 2 to 40 mTorr. These process parameters are provided by way of example and not intended to be limiting.

The method 300 then proceeds to step 318 where the substrate is patterned or etched using the patterned photo resist layer, described above with reference to step 310, the etch coating layer, described above with reference to step 312, the etched middle layer, described above with reference to step 314, and/or the etched bottom layer, described above with reference to step 316, as a masking element. Referring to the example of FIG. 12, a pattern is etched into the substrate 402 providing substrate pattern 412. As discussed above, the substrate 402 may include any plurality of layers, for example, formed on a semiconductor wafer. The substrate pattern 412 may be formed in one or more of the layers, or into the semiconductor wafer itself. In an embodiment, step 318 etches the substrate by feeding a chamber of a plasma tool with a mixture of chemical gases under a low chamber pressure. A component or concentration of the mixture of the chemical gases may be dependent upon the composition or compositions of the substrate 402. In one embodiment, the substrate 402 includes a silicon layer or a polysilicon layer. In this case, the mixture of chemical gases may include a fluorine-containing gas, such as $SF_6$, $CH_2F_2$, $CF_4$, $NF_3$, or combination thereof. A flow rate of the mixture of chemical gases may range from approximate 10 to 100 SCCM. The chamber pressure may range from approximate 2 to 10 mTorr. These process parameters are provided by way of example and not intended to be limiting.

Figure 12:
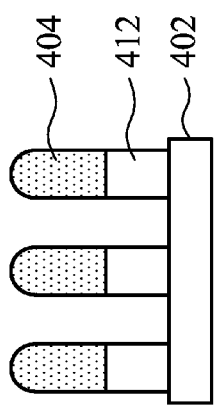
Figure 13:
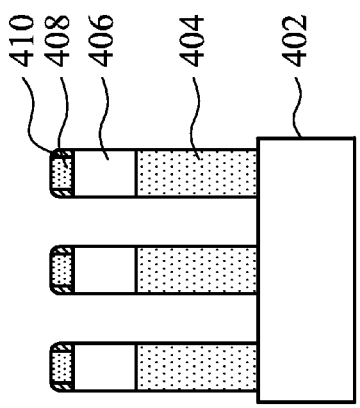

In an embodiment of step 318, one or more of the overlying layers may be removed concurrently with the etching of the substrate. For example, FIG. 12 illustrates that the patterned photoresist layer 408, the etch coating 410, and the middle layer 406 are removed.

The method proceeds to step 320 by performing a cleaning or etching process to remove undesired layer(s) from the substrate. Referring to the example of FIG. 14, the substrate pattern 412 is provided on the substrate 402 the overlying layer(s) having been removed. The step 320 may include using a plasma cleaning and/or a wet chemical cleaning process. Additional steps can be provided before, during, and after the method 300, and some of the steps described can be replaced, eliminated, or moved around for additional embodiments of the method 300.

In an embodiment, the substrate pattern 412 formed by the method 300 provides improved CD uniformity and side wall angel (SWA) uniformity across the substrate 402 in comparison with other methods, such as that described in FIG. 1. For example, in an embodiment, a CD range of a wafer patterned by using the method 100 is approximately 95 nanometer (nm) and a CD range of a wafer patterned by using the method 300 is approximately 10 nm. In another exemplary embodiment, a side wall angel (SWA) range of a wafer patterned by using the method 100 is approximately 15 degrees and a side wall angel (SWA) range of a wafer patterned by using the method 300 is approximately 2 degrees. The improved CD or the side wall angle (SWA) uniformity may be caused by more symmetrical pattern (e.g., pattern 412) and a smoother edge of the pattern (e.g., 412) fabricated by the method 300. Because of the improved side wall angel (SWA) range of patterns across a wafer by an embodiment of the method 300, a pattern-to-pattern overlay may be also improved.

Figure 14:
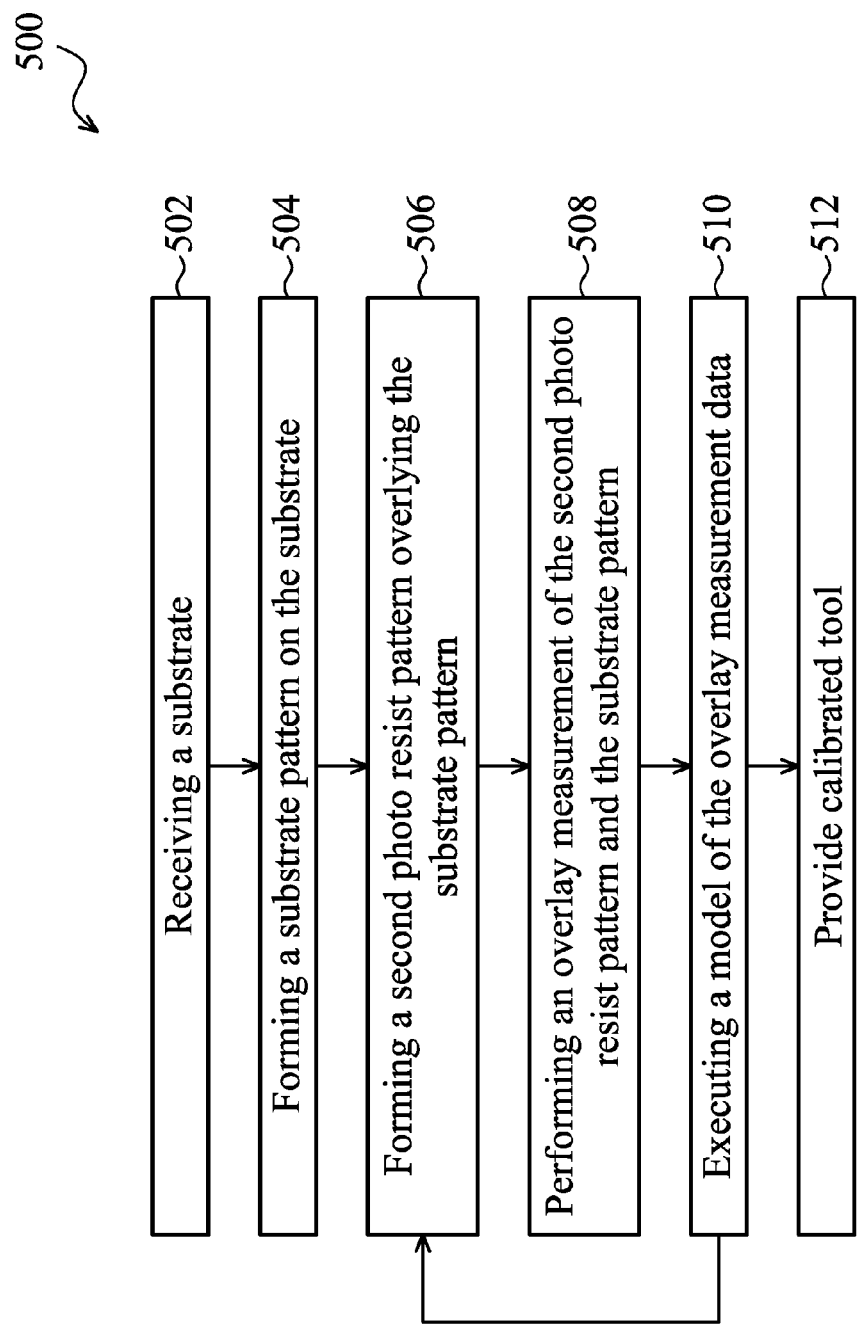
FIG. 14 is a flow chart of an embodiment of a method of calibrating a lithography exposing tool for implementing one or more embodiments of the present disclosure.

Referring to FIG. 14, a flow chart of a method 500 of calibrating or monitoring a lithography exposing tool used to provide a pattern onto a substrate. The method 500 may use a pattern fabricated by an embodiment of the method 300 or portion thereof. The method 500 begins at step 502 by receiving or obtaining a substrate. Step 502 may be substantially similar to step 302 of FIG. 7. The method 500 then proceeds to step 504 where the substrate is patterned. In an embodiment, patterning the substrate is performed using the method 300, described above with reference to FIG. 7. The step 504 may include using a first lithography exposing tool (e.g., step-and-scan tool or stepper) to form the substrate pattern on the substrate.

The method 500 then proceeds to step 506 where another photo resist pattern is formed on the substrate overlying the pattern described above with reference to step 504.

Figure 15:
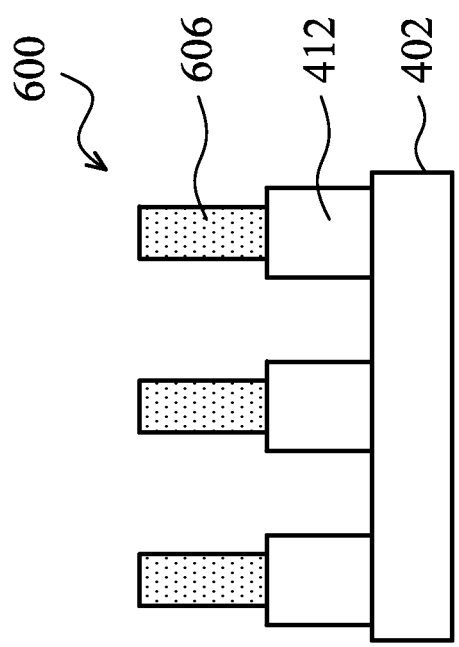
FIG. 15 is an example of an embodiment of a pattern on a substrate benefiting from one or more embodiments of the present disclosure.

Step 506 may include depositing a photo resist film on the substrate pattern, for example, by a spin-on coating process. Step 506 may include performing a dehydration process to enhance an adhesion of the bottom layer to the wafer. The dehydration process may include baking the substrate at a high temperature for a duration of time, or applying a chemical such as hexamethyldisilizane (HMDS) to the wafer. Step 506 may also include exposing the photo resist film formed on the substrate pattern using the lithography exposing tool that was also used in forming the substrate pattern described above at step 504 or a different lithography exposing tool may be used. In an embodiment, step 506 includes aligning a mask to the substrate pattern prior to exposing the photo resist film to a pattern. After exposure, a developer may be applied, such as tetramethylammonium hydroxide (TMAH), to the exposure photo resist film to form a photo resist pattern. FIG. 15, a cross-section of a device 600, is illustrative and described in detail below.

As shown in FIG. 15, a substrate pattern 412 is formed on a substrate 402. The substrate pattern 412 and/or the substrate 402 may be substantially similar to as described above with reference to FIGS. 7-13. The substrate pattern 412 may be formed using one or more processes described above in step 504, described above with reference to FIG. 14. In an embodiment, the substrate pattern 412 may be formed using a method substantially similar to the method 300, described above with reference to FIG. 7.

A photo resist pattern 606 is formed overlying the substrate pattern 412. The photo resist pattern 606 may be formed uses processes such as those described above with reference to step 506 of the method 500. In an embodiment, one or more layers may interpose the substrate pattern 412 and the photo resist pattern 606.

In an embodiment, the photo resist pattern 606 is formed using the same lithography exposing tool (e.g., stepper or step-and-scan tool) as used to form the substrate pattern 412. In another embodiment, the photo resist pattern 606 is formed using a distinct and separate lithography exposing tool. For example, the lithography exposure tools may be separate tools on a fabrication line having the same or different manufacturer or model. In an embodiment, the lithography tool used to form the substrate pattern 412 is a mother tool or a baseline tool.

Figure 16:
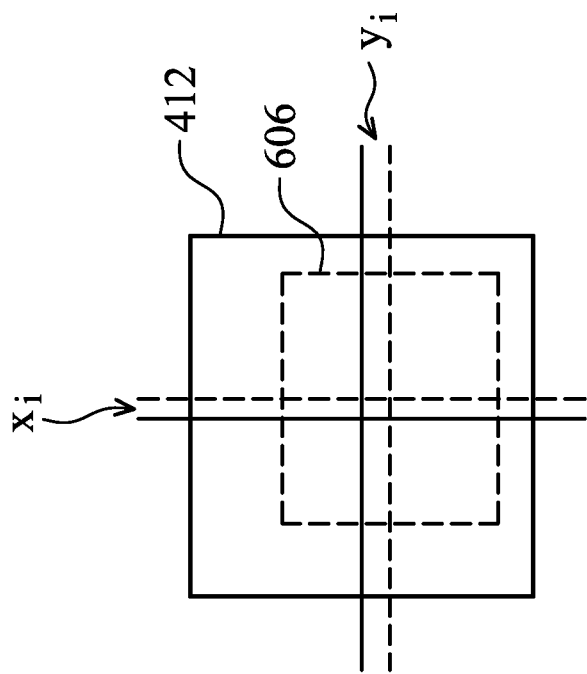
FIG. 16 is an example of a pattern to pattern misalignment.

The method 500 then proceeds to step 508 by executing an overlay measurement of the photo resist pattern formed above in step 506 with respect to the substrate pattern formed above in step 504. Referring to the example of FIG. 15, an overlay measurement of the photo resist pattern 606 to the wafer substrate pattern 412 is performed. In an embodiment, executing an overlay measurement includes measuring a difference between a center of the substrate pattern 412 and a center of the photo resist pattern 606 formed over the substrate pattern 412. This measurement may be performed using a separate overlay tool or a portion of a lithography exposing tool. In an embodiment, executing an overlay measurement includes measuring a difference in an X direction and/or in Y direction (e.g., a direction in a plane parallel a top surface of the substrate 402) between a center of the substrate pattern 412 and a center of the photo resist pattern 606 formed over the substrate pattern 412 as shown in FIG. 16, described in further detail below.

FIG. 16 is an exemplary top view of the photo resist pattern 606 printed on the substrate pattern 412, described above with reference to FIG. 16. A difference denoted $x_i$ is referred to as a misalignment of the photo resist pattern 606 to the substrate pattern 412 in X direction. A difference denoted $y_i$ is referred to as a misalignment of the photo resist pattern 606 to the substrate pattern 412 in a Y direction, substantially perpendicular to the X direction.

The method 500 proceeds to step 510 where a model of the overlay is generated. The model may be generated using measurement data $x_i$ and $y_i$. In an embodiment, generating the model includes using an algorithm to generate a set of parameters, such as an inter-translation (shift) in X/Y direction, an inter-symmetric rotation, an inter-non orthogonal rotation, an inter-expansion (scaling) in X/Y direction, an intra-symmetric rotation, an intra-asymmetric rotation, an intra-symmetric magnification, and an intra-asymmetric magnification.

In an embodiment, a misalignment (or error) in X/Y directions is within a specification, and the method 500 proceeds to step 512 to finish the monitoring (or calibrating) a lithography exposing tool.

In an embodiment, a misalignment (or error) in X/Y direction(s) is out of specification, and the method 500 proceeds back to step 506. In an embodiment, the resist pattern (e.g., 606) is stripped and reprint the photo resist pattern with the set of parameters generated by the model described above. In a further embodiment, parameters generated from a regression algorithm are fed back into a lithography exposing tool. This can be repeated for many times until the shift difference (or error) is minimized and within a specification of a lithography exposing tool or a lithography process.

Once the parameters are determined to be within specification, the method 500 proceeds to step 512 by finishing a lithography exposing tool calibration. Additional steps can be provided before, during, and after the method 500, and some of the steps described can be replaced, eliminated, or moved around for additional embodiments of the method 500.

As shown in FIG. 15, in one embodiment, if the second photo resist pattern (e.g., pattern 606 of FIG. 16) is defined using a lithography exposing tool that is also used for printing the underlying substrate pattern (e.g., pattern 604 of FIG. 16), the method 500 may be used as a method of monitoring a given lithography exposing tool over time. In this embodiment, by performing the method 500, the first lithography exposing tool is monitored or calibrated.

In an embodiment, the photo resist pattern (e.g. pattern 606) is printed at a second lithography exposing tool from that of the underlying pattern (e.g., pattern 604). In such an embodiment, a tool to tool overlay (TTO) matching or as a machine to machine overly (MMO) matching may be performed. Therefore, in an embodiment, the second lithography exposing tool is calibrated to be close to the first lithography exposing tool.

Additionally, because of an improvement of a side wall angle (SWA) of the substrate pattern (first pattern) (e.g., pattern 604 as described in FIG. 16), the overlay measurement of the resist pattern to the substrate pattern (e.g. pattern 604 over pattern 606 as described in FIG. 16) is more accurate and therefore a machine to machine overlay (MMO) is also improved. For example, in an embodiment, a machine to machine overlay measurement is improved from approximately 12.6 nm in X direction shift and approximately 13.3 nm in Y direction shift to approximately 4.6 nm in X direction shift and approximately 6.5 nm in Y direction shift.

Thus, the present disclosure describes in an embodiment, a method of patterning a substrate to form a substrate pattern. The method includes receiving a substrate, forming a first photo resist pattern, depositing an etch coating layer over the first photo resist pattern formed on the middle layer, and forming the substrate pattern in the substrate by performing an etching process. Forming the first photo resist pattern may include depositing a bottom layer on the substrate, depositing a middle layer on the bottom layer, and depositing a first photo resist layer on the middle layer. Thereafter, the first photo resist layer may be exposed so that the first photo resist pattern is formed on the middle layer and the bottom layer. The method may further include performing a lithography exposing tool calibration using a second photo resist pattern printed over the substrate pattern formed in the substrate. Depositing the middle layer may include depositing a bottom antireflection coating (BARC) doped with silicon (Si). Depositing the middle layer may further include doping the BARC with the silicon (Si) ranging from approximate 1 to 8 percent in the BARC. Depositing the etch coating layer may include using a plasma process. Depositing the etch coating layer may further include using an organic alkane or a mixture of organic alkanes. Performing the etching process may include etching the etch coating layer, the middle layer, the bottom layer and the substrate.

In another embodiment, a method of forming a pattern is described. The method includes receiving a substrate, forming a first photo resist pattern, depositing an etch coating layer over the first photo resist pattern, and forming a substrate pattern in the substrate by performing an etching process. Forming the first photo resist pattern may include depositing a bottom layer on the substrate, depositing a middle layer doped with a silicon on the bottom layer, depositing a first photo resist layer on the middle layer, and forming the first photo resist pattern on the middle layer using a lithography process. Performing the etching process may include etching the etch coating layer, etching the middle layer, etching the bottom layer, and/or etching the substrate. The method may further include performing a lithography exposing tool calibration using a second photo resist pattern formed over the substrate pattern formed in the substrate. Depositing a middle layer may include depositing a bottom anti reflectance coating (BARC) doped with a Si ranging from approximate 1 to 8 percent in the BARC resist. Depositing the etch coating layer may include using a plasma process to form an organic layer.

In another embodiment described herein, a method of calibrating an exposing tool is provided. The method includes forming a substrate pattern in a substrate. Forming the substrate pattern includes providing a first patterned photo resist layer having an etch coating layer disposed thereon and using the first patterned photo resist layer to pattern an underlying layer. The patterned underlying layer is then used as a masking element when etching the substrate pattern. A second photo resist pattern is formed over the substrate pattern. An overlay measurement of the second photo resist pattern to the substrate pattern is performed.

The method may further include using a model to generate a set of correlation parameters. The underlying layer may include at least one of a photosensitive material (e.g., bottom layer) and a bottom anti-reflective coating (BARC) material (e.g. middle layer). Executing the overlay measurement may include measuring a distance between a first point on the first patterned photo resist layer and a second point on the second photoresist pattern. The distance measured may be substantially parallel a top surface of the substrate (e.g., an X or Y direction).

The method may include determining a correlation between a first lithography exposure tool and a second lithography exposure tool from the overlay measurement. In an embodiment, the patterned photo resist layer is formed using a first lithography exposure tool and the second photo resist pattern is formed using a second lithography exposure tool. The first and second lithography may be exposure tools are step-and-scan tools.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of calibrating an exposing tool, the method comprising:
   forming a substrate pattern in a substrate, wherein forming the substrate pattern includes:
      providing a first patterned photo resist layer having an etch coating layer disposed thereon;
      using the first patterned photo resist layer and the etch coating layer to pattern an underlying layer;
      using the patterned underlying layer as a masking element when etching the substrate pattern;
   forming a second photo resist pattern over the substrate pattern; and
   executing an overlay measurement of the second photo resist pattern to the substrate pattern.

2. The method of claim 1, wherein executing the overly measurement includes using a model to generate a set of correlation parameters.

3. The method of claim 1, wherein the underlying layer includes at least one of a photosensitive material and a bottom anti-reflective coating (BARC) material.

4. The method of claim 1, wherein the executing the overlay measurement includes measuring a distance between a first point on the first patterned photo resist layer and a second point on the second photoresist pattern, wherein the distance measured is substantially parallel a top surface of the substrate.

5. The method of claim 1, further comprising: determining a correlation between a first lithography exposure tool and a second lithography exposure tool from the overlay measurement.

6. The method of claim 1, wherein the patterned photo resist layer is formed using a first lithography exposure tool and the second photo resist pattern is formed using a second lithography exposure tool.

7. The method of claim 1, wherein the first and second lithography exposure tools are step-and-scan tools.

8. The method of claim 1,
   wherein the providing the first patterned photo resist layer having the etch coating layer disposed thereon includes depositing the etch coating layer including carbon on sidewalls of the first patterned photo resist layer.

9. The method of claim 1,
   wherein the using the patterned underlying layer as the masking element when etching the substrate pattern includes removing a portion of the etch coating layer and the patterned underlying layer during the etching the substrate pattern.

10. A method, comprising:
    providing a substrate having a first pattern disposed therein, wherein the first pattern includes a first portion of the substrate interposing two trenches;
    forming a pattern of photo resist features on the first pattern, wherein the pattern of photo resist features includes a first photo resist feature disposed on the first portion of the substrate;
    performing an overlay measurement of the pattern of photo resist features with respect to the first pattern; and
    using the overlay measurement to determine a calibration of a first lithography exposure tool.

11. The method of claim 10, further comprising:
    forming the first pattern using a second lithography exposure tool; and
       wherein the forming the pattern of photo resist features uses the first lithography exposure tool different than the second lithography exposure tool.

12. The method of claim 10, wherein the executing the overlay measurement includes:
    measuring a difference between a center of the first photo resist feature and a center of the first portion of the substrate.

13. The method of claim 10, wherein the executing the overlay measurement includes:
    measuring a difference in each of an x-direction and a y-direction between a center of the first photo resist feature and a center of the first portion of the substrate.

14. The method of claim 10, further comprising:
    generating a model using a difference between a center of the first photo resist feature and a center of the first portion of the substrate, wherein the model includes defining a parameter of at least one of an inter-translation (shift) in an x-direction or a y-direction, an inter-symmetric rotation, an inter-non orthogonal rotation, an inter-expansion in x-direction or a y-direction, an intra-symmetric rotation, an intra-asymmetric rotation, an intra-symmetric magnification, and an intra-asymmetric magnification.

15. The method of claim 10, wherein the using the overlay measurement to determine the calibration of the lithography exposure tool includes:

determining a misalignment in one of an x-direction and a y-direction;

removing the pattern of photo resist after determining the misalignment; and forming a second pattern of photo resist on the first pattern.

16. A method, comprising:

forming a first pattern in a substrate, wherein forming the first pattern includes:

using a photo resist layer and an etch coating layer disposed on sidewalls of the photo resist layer as masking elements to pattern an underlying layer; and using the patterned underlying layer as a masking element to etch the first pattern into the substrate;

forming a second pattern over the first pattern;

measuring a difference between a center of the first pattern and a center of the second pattern; and comparing the difference with a specification to calibrate or monitor a lithography exposure tool, wherein the lithography exposure tool is used to define at least one of the first pattern and the second pattern.

17. The method of claim 16, wherein the forming the first pattern in the substrate further includes:

using a plasma process to deposit the etch coating layer on the photo resist layer, wherein the depositing includes forming the etch coating layer over two opposing sidewall surfaces of a first feature of the photo resist layer;

and wherein the using the patterned underlying layer as the masking element to etch the first pattern into the substrate includes removing a portion of the etch coating layer and the photo resist layer.

18. The method of claim 16, wherein the comparing the difference with the specification to calibrate or monitor the lithography tool includes generating model of an overlay between the first pattern and the second pattern.

19. The method of claim 18, wherein the generated model includes an algorithm to generate a set of parameters selected from the group consisting of inter-translation (shift) in an x- or y-direction, an inter-symmetric rotation, an inter-non orthogonal rotation, an inter-expansion (scaling) in an x- or y-direction, an intra-symmetric rotation, an intra-asymmetric rotation, an intra-symmetric magnification, and an intra-asymmetric magnification.

20. The method of claim 16, wherein the forming the second pattern includes forming a photo resist feature directly on a substrate feature of the first pattern.

\* \* \* \* \*